United States Patent
Yu

(10) Patent No.: US 12,272,376 B2
(45) Date of Patent: Apr. 8, 2025

(54) DIALOG ENHANCEMENT USING ADAPTIVE SMOOTHING WHICH DEPENDS EXPONENTIALLY ON A SMOOTHING FACTOR

(71) Applicant: Dolby Laboratories Licensing Corporation, San Francisco, CA (US)

(72) Inventor: Xuemei Yu, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 386 days.

(21) Appl. No.: 17/638,839

(22) PCT Filed: Aug. 26, 2020

(86) PCT No.: PCT/US2020/048034
§ 371 (c)(1),
(2) Date: Feb. 27, 2022

(87) PCT Pub. No.: WO2021/041568
PCT Pub. Date: Jun. 4, 2021

(65) Prior Publication Data
US 2022/0277766 A1     Sep. 1, 2022

Related U.S. Application Data

(60) Provisional application No. 62/963,711, filed on Jan. 21, 2020, provisional application No. 62/900,969, filed on Sep. 16, 2019.

(30) Foreign Application Priority Data

Aug. 27, 2019    (WO) ................ PCT/CN2019/102775

(51) Int. Cl.
G10L 25/81    (2013.01)
G10L 21/0208   (2013.01)
(Continued)

(52) U.S. Cl.
CPC .......... G10L 25/81 (2013.01); G10L 21/0208 (2013.01); *G10L 2025/783* (2013.01)

(58) Field of Classification Search
CPC .............. G10L 25/81; H04R 5/04; H04R 1/10
(Continued)

(56) References Cited

U.S. PATENT DOCUMENTS 6,351,731 B1    2/2002  Anderson
6,487,257 B1   11/2002  Gustafsson
(Continued)

FOREIGN PATENT DOCUMENTS

CA       2909580     *  4/2014   ............... H04R 5/04
CN     101197130 B       6/2008
(Continued)

OTHER PUBLICATIONS

Esch, T. et al "Efficient musical noise suppression for speech enhancement systems" ICASSP, IEEE International Conference on Acoustics, Speech and Signal Processing—Proceedings (Sep. 24, 2009): 4409-4412.

(Continued)

*Primary Examiner* — Farzad Kazeminezhad

(57) ABSTRACT

A method of enhancing dialog intelligibility in an audio signal, comprising determining a speech confidence score that the audio content includes speech content, determining a music confidence score that the audio content includes music correlated content, in response to the speech confidence score, and applying a user selected gain of selected frequency bands of the audio signal to obtain a dialogue enhanced audio signal. The user selected gain is smoothed by an adaptive smoothing algorithm, an impact of past frames in said smoothing algorithm being determined by a smoothing factor, the smoothing factor being calculated in response to the music confidence score, and having a rela- (Continued)

tively higher value for content having a relatively higher music confidence score and a relatively lower value for speech content having a relatively lower music confidence score, so as to increase the impact of past frames on the dialogue enhancement of music correlated content.

14 Claims, 7 Drawing Sheets

(51) Int. Cl.
*G10L 25/60* (2013.01)
*H04R 1/10* (2006.01)
*H04R 5/04* (2006.01)
*G10L 25/78* (2013.01)

(58) Field of Classification Search
USPC .................................................... 704/21.001
See application file for complete search history.

(56) References Cited

U.S. PATENT DOCUMENTS

| | | | |
|---|---|---|---|
| 9,171,552 | B1 | 10/2015 | Yang |
| 2003/0101050 | A1 | 5/2003 | Khalil |
| 2005/0143989 | A1 | 6/2005 | Jelinek |
| 2009/0287496 | A1 | 11/2009 | Thyssen |
| 2011/0178805 | A1* | 7/2011 | Takeuchi ............ G10L 25/60 |
| | | | 704/E21.001 |
| 2013/0295868 | A1 | 11/2013 | Bharitkar |
| 2016/0155457 | A1 | 6/2016 | Bruhn |
| 2017/0249951 | A1 | 8/2017 | Koppens |

FOREIGN PATENT DOCUMENTS

| | | | |
|---|---|---|---|
| CN | 101399039 B | 4/2009 | |
| CN | 101647059 B | 2/2010 | |
| CN | 104078050 A | 10/2014 | |
| CN | 104079247 B | 10/2014 | |
| CN | 105074822 B | 11/2015 | |
| CN | 107112023 B | 8/2017 | |
| DK | 3800900 * | 4/2019 | ............ H04R 1/10 |
| JP | 2009288669 A | 12/2009 | |
| JP | 2011065093 A | 3/2011 | |
| WO | 2008106036 A2 | 9/2008 | |
| WO | 2014160678 A2 | 10/2014 | |

OTHER PUBLICATIONS

Ben Aicha, Anis "Adaptive Noise Smoothing for Speech Enhancement Filters" EuroCon Jul. 1-4, 2013, IEEE, pp. 1709-1714.

Huang, Shyh-Fang, et al "Adaptive Voice Smoothing with Optimal E-Model Method for VoIP Services" IEICE Trans. Commun., vol. E89-B, No. 6, Jun. 2006, pp. 1862-1868.

Nahma, L. et al "Improved a Priori SNR Estimation in Speech Enhancement" IEEE, 2017 23rd Asia-Pacific Conference on Communications.

* cited by examiner

DIALOG ENHANCEMENT USING ADAPTIVE SMOOTHING WHICH DEPENDS EXPONENTIALLY ON A SMOOTHING FACTOR

CROSS-REFERENCE TO RELATED APPLICATIONS

This application claims priority of U.S. Provisional Patent Application No. 62/963,711, filed Jan. 21, 2020, U.S. Provisional Patent Application No. 62/900,969, filed Sep. 16, 2019, and International Patent Application No. PCT/CN2019/102775, filed Aug. 27, 2019, all of which are hereby incorporated by reference in their entireties.

FIELD OF THE INVENTION

This invention relates to audio processing including dialogue enhancement. Specifically, the invention relates to improving dialogue enhancement by smoothing an amplified extracted dialogue.

BACKGROUND

Dialogue enhancement is an algorithm to enhance speech/dialog in an audio signal to improve intelligibility. One example of a dialogue enhancement system is shown in FIG. 1. The dialogue enhancement system here includes a speech detector used to detect presence of speech. The speech detector may be a Voice Activity Detection (VAD) or a machine learning based speech classifier. The output from the speech detector (ON/OFF) is multiplied by a user selected gain, and then input to a dialogue enhancement module. In order to avoid some unwanted artifacts, the gain is smoothed before being input to the dialogue enhancement.

It is desirable to even further improve the performance of such dialogue enhancement algorithms.

SUMMARY OF THE INVENTION

Methods, systems, and computer program product of method of enhancing dialog intelligibility in audio are described.

A first aspect of the invention relates to a method of enhancing dialog intelligibility in an audio signal, comprising determining, by a speech classifier, a speech confidence score that the audio content includes speech content, determining, by a music classifier, a music confidence score that the audio content includes music correlated content, in response to the speech confidence score, applying, by a dialog enhance module, a user selected gain of selected frequency bands of the audio signal to obtain a dialogue enhanced audio signal, wherein the user selected gain is smoothed by an adaptive smoothing algorithm, an impact of past frames in said smoothing algorithm being determined by a smoothing factor, the smoothing factor being selected in response to the music confidence score, and having a relatively higher value for content having a relatively higher music confidence score and a relatively lower value for speech content having a relatively lower music confidence score, so as to increase the impact of past frames on the dialogue enhancement of music correlated content.

By "music related content" is simply intended content for which speech classification can be expected to be more difficult due to presence of music. By increasing the impact of past frames, the dialogue enhancement becomes less sensitive to "false positives" in the speech classifier.

The smoothing factor relates to the number of frames taken into consideration in the adaptive smoothing. So, for a large smoothing factor, more frames are taken into account, thus making the application of dialogue enhancement more gradual (slower) and thus avoiding fluctuating boost caused by "false positives". For a small smoothing factor, fewer frames are taken into account, thus allowing for faster application of dialogue enhancement. The relationship between smoothing factor and the smoothing function may be direct (e.g. the smoothing factor defines how many frames that are taken into account, or indirect (e.g. the smoothing factor defines the slope of decline in relative weight of a past frame.

The adaptive smoothing factor makes it possible to adapt the smoothing factor based on the content. For content where music is present (high music confidence score) the smoothing factor can be set relatively large (e.g. in the order of 500 ms or larger), while for content where music is not present (low music confidence score) the smoothing factor can be set relatively small (e.g. in the order of 100 ms or smaller).

The smoothing factor may be further adapted based on additional parameters. For example, a low signal-to-noise ratio (SNR) may result in a larger smoothing factor, and a large latency in the speech classifier may result in a larger smoothing factor.

According to a second aspect, the speech and music classifiers receive an audio signal, the audio signal including audio content. The speech classifier determines the speech confidence and the music classifier determines the music confidence. In response to an output of the speech and classifiers, an adaptive smoothing algorithm calculates a higher value of a dialog smoothing factor for the music correlated content and a lower value of the dialog smoothing factor for the pure speech content. The adaptive smoothing algorithm adjusts the dialog smoothing factor based on SNR of the audio content. A lower SNR corresponds to a larger increase of the dialog smoothing factor. A transient detector could be used to measure the latency of speech classifier in real time, the dialog smoothing factor should be increased linearly along with the latency is increased. A dialog enhancer enhances the audio content based on the adjusted dialog smoothing factor to generate enhanced audio.

BRIEF DESCRIPTIONS OF THE DRAWINGS

The present invention will be described in more detail with reference to the appended drawings, showing currently preferred embodiments of the invention.

DETAILED DESCRIPTION OF CURRENTLY PREFERRED EMBODIMENTS

Figure 1:
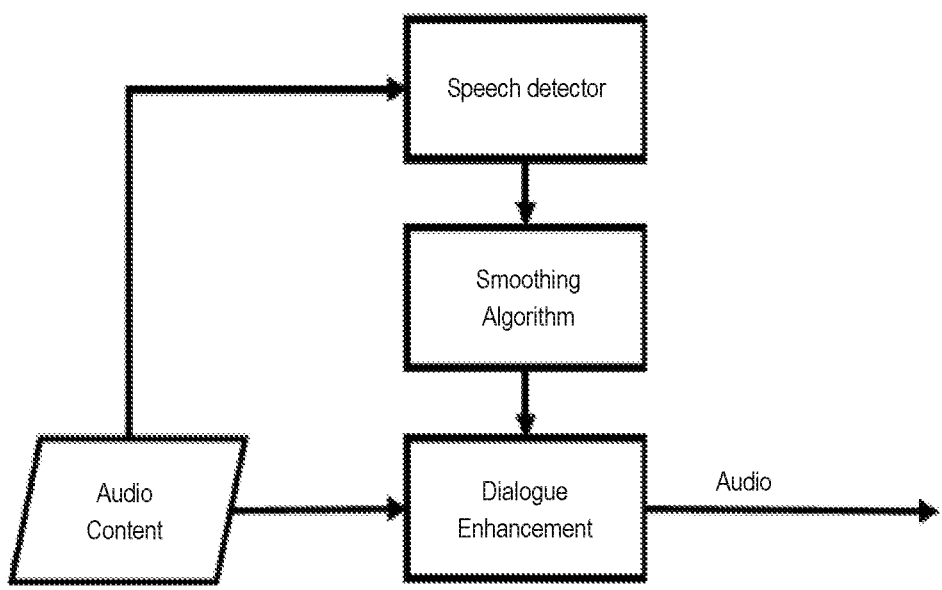
FIG. 1 is a block diagram illustrating a conventional dialogue enhancement system.

A conventional dialogue enhancement algorithm, es. as illustrated in FIG. 1, typically suffers from two major drawbacks:
1. The accuracy of classifier is not 100%. There are some typical difficult cases for speech classifier, for example, speech/singing voice over music and low-SNR content. In some situations, the dialogue extractor will erroneously identify audio content as dialogue when it is in fact not dialogue. Frames which are erroneously classified as dialogue are sometimes referred to as "false positives". As a result, the dialogue boost fluctuates when music is present and when SNR is low.
2. The latency of the speech detector depends on the contents, and the latency may vary from below 100 ms to above 500 ms. As a result, the initial utterance (the beginning) of words may be missed, leading to an abrupt dialogue boost.

In an attempt to overcome these drawbacks, look-ahead is sometimes introduced to reduce the false positive and latency of speech classifier. For example, a 2000 ms latency may be acceptable on the encoding side. However, on the mobile playback side, latency is very sensitive and critical, and look-ahead is not allowable. As a result, the accuracy and latency issues are even worse in a conventional speech classifier.

Additionally, the above artifacts may be eliminated or at least mitigated, by using a conventional smoothing algorithm, as shown in FIG. 1. However, a fixed smoothing factor will not satisfy all use cases. For example, if the first 300 ms of words are missed due to accuracy or latency issues, which is very common in speech over music content, a 500 ms smoothing factor will be needed to make the boost sound natural and comfortable. However, such large smoothing factor is not applicable to the normal speech content, whose accuracy is high, and the latency is usually only 100 ms.

Figure 2:
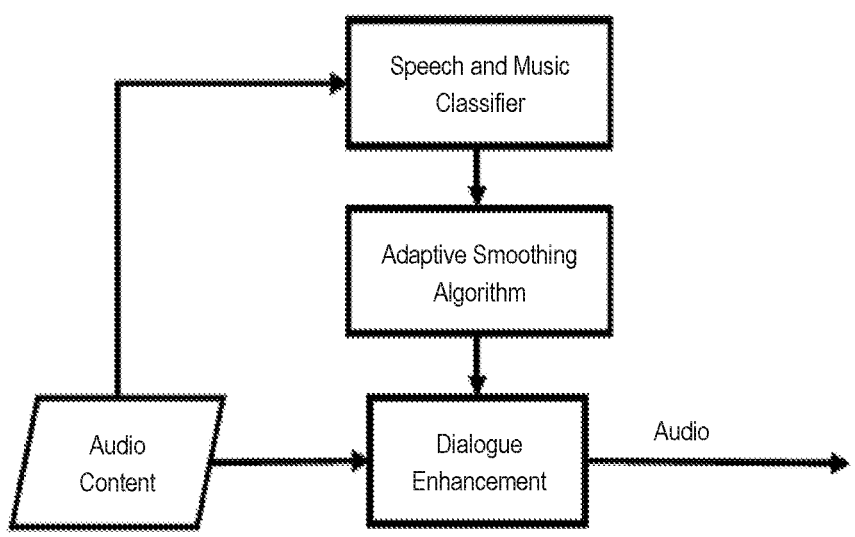
FIG. 2 is a block diagram illustrating an example dialogue enhancement system implementing dynamic smoothing according to an embodiment of the present invention.

The technology disclosed in this specification relate to dialogue enhancement that result in dialogs that are not only pronounced but also comfortable, with less artifacts. FIG. 2 shows an example dialogue enhancement system 200 implementing dynamic smoothing according to an embodiment of the invention. As shown in FIG. 2, the present invention includes an adaptive smoothing algorithm to automatically choose the most appropriate smoothing factor for different content and context to reduce the artifact of dialogue enhancement.

Some examples of how the smoothing factor may be adapted are the following:

Take use of history and current music confidence score

If the music is dominant in the last few frames or in current frame, the smoothing factor should be tended to large, for example 500 ms or more, to filter out any false positives.

Reduce the smoothing for pure speech content

If the content is pure speech, the smoothing factor could be small for example, 50 ms to 100 ms to make the dialogue boost more pronounced.

Take use of the SNR.

SNR could be measured to help guiding the smoothing, the false positive/negative tends to high with low SNR content, as a result, the smoothing factor should be more conservative to be large, for example, 500 ms.

Dynamically change the smoothing factor by measuring the latency in real time

Figure 3:
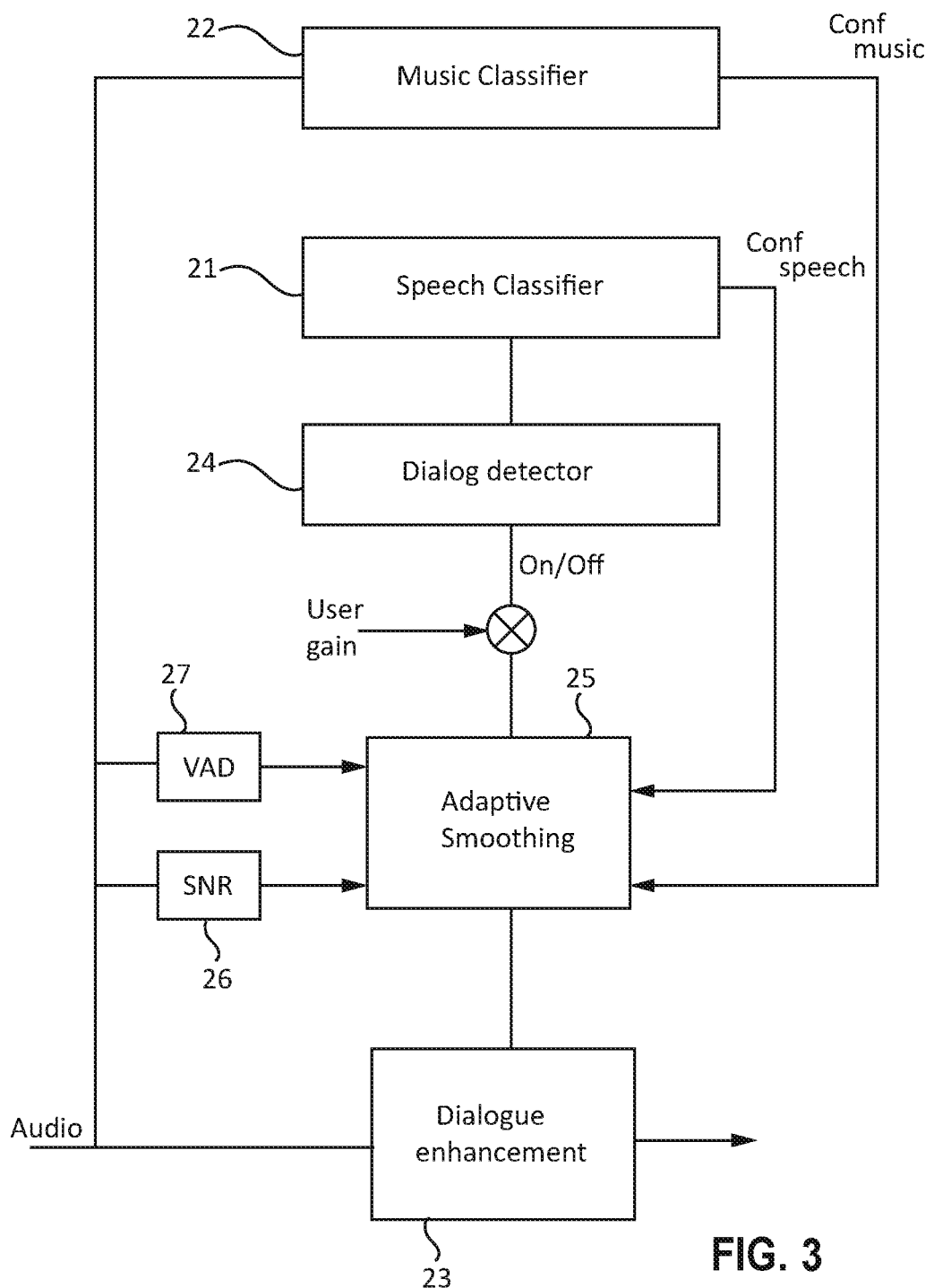
FIG. 3 is a more detailed block diagram of a dialogue enhancement system according to an embodiment of the invention.

A VAD or transient detector could be used to measure the latency of speech classifier in real time, the smoothing factor should be increased linearly along with the latency is increased. Depending on the contents, the latency could be small as 100 ms or large to 500 ms A more detailed embodiment of the invention is shown in FIG. 3, where the system 20 includes a speech classifier 21 and a music classifier 22. The speech classifier generates a speech confidence score, indicating a likelihood that a specific frame of the audio signal includes speech (dialogue). Similarly, the music classifier generates a music confidence score, indicating a likelihood that a specific frame of the audio signal includes music. The classifiers may be based on any appropriate technology, and may for example comprise machine learning auto regression (AR) models. The direct output from the classifiers is usually a real value from $-\infty$ to $\infty$, which is mapped to a value between zero and one using a sigmoid function (conf_score=$1/(1+e^{ax+b})$), where x is the direct output and a and B are constants.

The speech confidence score is used to activate a dialogue enhance module 23, e.g. of a type known in the art. In a simple case, the dialogue enhancement module is static, and configured to boost preselected frequencies of the audio signal by a user selected gain. In more complex cases, the enhancement module makes a dynamic estimation of a dialogue component, and boosts this estimated dialogue component.

In principle, the speech confidence score may be used directly as an activation signal, which is multiplied by the user gain. However, it may be advantageous to first map the confidence score to a binary value ON/OFF. In FIG. 2, such a mapping is provided by a dialogue detector 24. Various methods are possible to achieve such a mapping. For example, the mapping may be a simple threshold, e.g. 0.5, so that a confidence score greater than 0.5 gives an ON signal, and a confidence score smaller than 0.5 gives an OFF signal. Alternatively, a hysteresis model may be applied, such that the threshold is different depending on the binary value of the preceding frame. For example, threshold=0.4 when the previous value was ON, and threshold=0.6 when the previous value was OFF:

The confidence score or the binary activation signal is multiplied by the user gain, which is supplied to an adaptive smoothing module 25 before being fed to the dialogue enhancement module 23. Much like the conventional smoothing module in FIG. 1, the adaptive smoothing filter 25 applies a smoothing filter over a smoothing factor of a specific length. However, in module 25, the length of the smoothing factor is adaptive, and based on e.g. the speech confidence score and the music confidence score.

The system further comprises a signal-to-noise ratio (SNR) detector 26, which detects an SNR in the audio signal (frame by frame) and provides this to the adaptive smoothing module 25.

Figure 4:
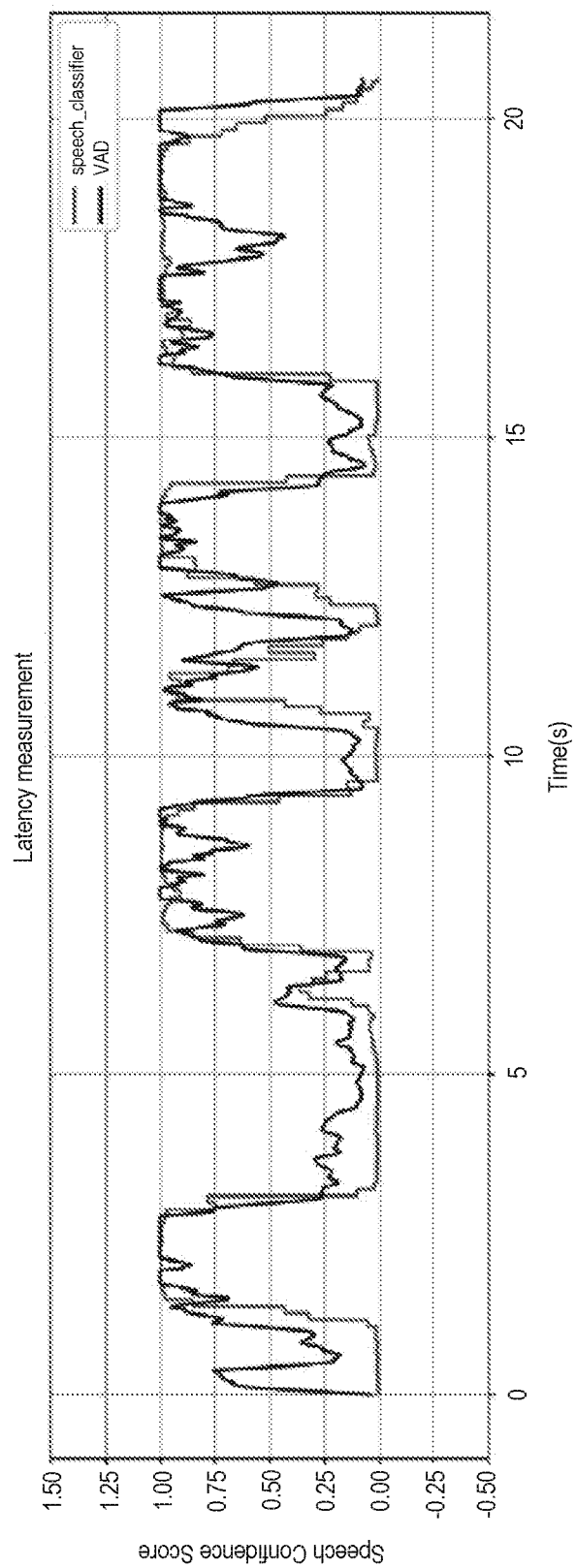
FIG. 4 is a flow chart illustrating how various factors may influence the smoothing factor according to an embodiment of the invention.

The system further comprises a less complex, but fast, voice detector 27, such as a conventional voice activation detector (VAD) or a transient detector. The output from the voice detector 27 is provided to the adaptive smoothing module to enable determination of a latency of the speech classifier. FIG. 4 shown an example of speech classifier latency, by plotting the speech confidence score and output from a VAD.

The adaptive smoothing module may use various smoothing functions to smooth the gain applied to the dialogue enhancement module 23. Generally speaking, the smoothing factor relates to the number of past frames that are taken into account when determining the gain for a current frame. In a simple example, the smoothing factor may define a window of past frames which are included in a moving average to determine the smoothed gain for a current frame.

In another example, the filter is a weighted average, a one-pole filter method as below:

$$\text{Out}(n) = \alpha \, \text{Out}(n-1) + (1-\alpha)\text{In}(n),$$

where Out(n) is the smoothed output gain of the current frame, Out(n−1) is the smoothed output gain of the previous frame, In(n) is the original input gain of the current frame, and a is an adaptively adjusted variable between zero and one. It is clear that the impact of a past frame will decline exponentially with alpha as the base. The larger the value of a is, the slowly will a past frame fade, and the more smoothly output gain changes.

The relationship between a and the smoothing factor may for example be as follows:

$$\alpha = 0.5^{\text{samples per frame}/(\text{sample rate} \ast \text{smoothing factor})}$$

The smoothing factor could be e.g. 50 ms, 300 ms, 500 ms or even is depending on the circumstances as discussed herein.

Figure 5:
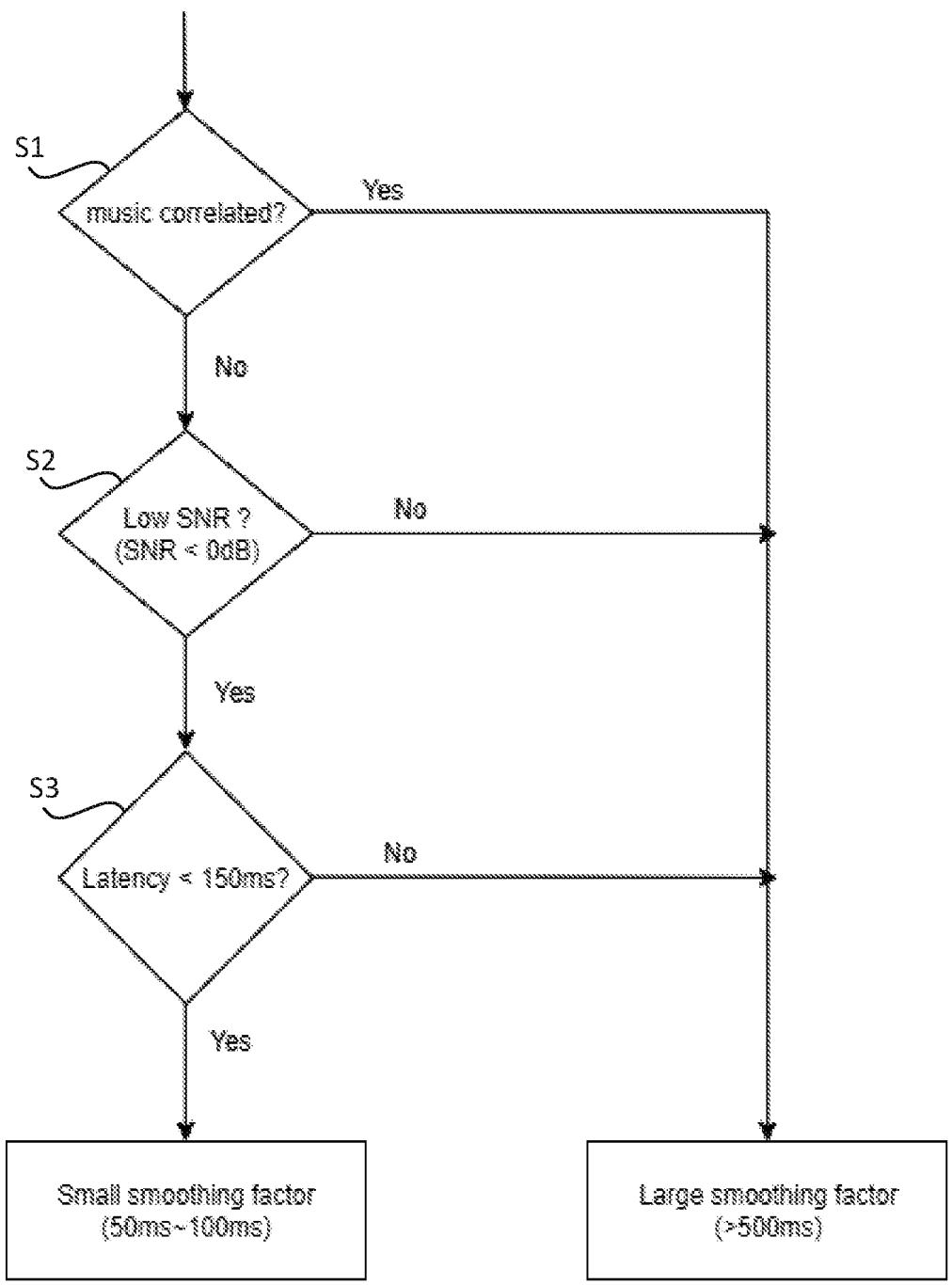
FIG. 5 illustrates using VAD or transient detector to measure latency of the speech classifier.

An example of how the smoothing factor is adaptively set is provided by the simple flow chart in FIG. 5. In this simple example, there are only two possible smoothing factors; a small factor, 50-100 ms, and a large factor length, >500 ms.

First, in step S1, the music confidence score is used to determine if the audio signal is music correlated. In a simple approach, the determination is performed by comparing the music confidence score of the current frame with a threshold, thus generating a binary signal ON/OFF. A hysteresis model may also be applied, using the binary value of one or several preceding frames. If the determination is positive, i.e. the frame is found to be music correlated, then the larger smoothing factor (here >500 ms) is applied.

If the content is not music correlated, processing continues to step S2, where the SNR from detector 26 is compared to a threshold, e.g. 0 dB. If the SNR is below the threshold, indicating that the signal is weak in relation to the noise, then again the larger (here >500 ms) smoothing factor is applied.

Further, in step S3, latency of the speech classifier is compared to a threshold, es. 150 ms. If the latency is not below the threshold, again the larger (here >500 ms) smoothing factor is applied.

For all other content, which may be considered to be "pure speech", a small smoothing factor (here in the range 50-100 ms) is applied.

Figure 6:
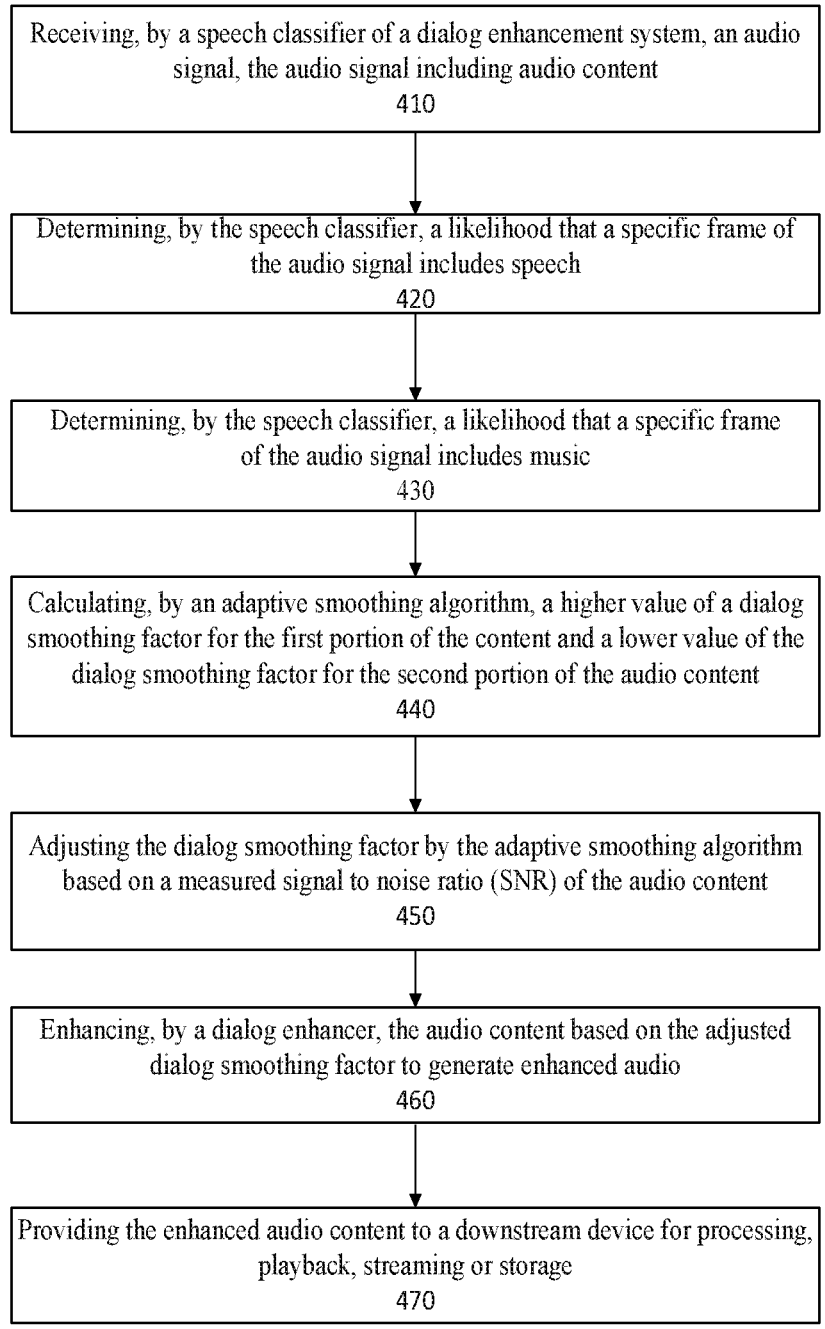
FIG. 6 is a flowchart illustrating an example process of dialogue enhancement using dynamic smoothing.

FIG. 6 is a further flowchart illustrating an example process 400 of dialogue enhancement using dynamic smoothing. Process 400 can be performed by a dialog enhancement system that includes one or more processors.

The speech and music classifiers of the dialog enhancement system receive (410) an audio signal, the audio signal including audio content. The speech classifier of the dialog enhancement system determines (420) the speech confidence. The music classifier determines (430) the music confidence.

In response to an output of the speech and music classifiers, an adaptive smoothing algorithm calculates (440) a higher value of a dialog smoothing factor for the music correlated content and a lower value of the dialog smoothing factor for the pure speech content. The adaptive smoothing algorithm adjusts (450) the dialog smoothing factor based on a measured signal to noise ratio (SNR) of the audio content. A lower SNR value corresponds to a larger increase of the dialog smoothing factor.

In some implementations, the system adjusts the dialog smoothing factor based on latency. The latency-based adjusting can include measuring, by a transient detector, an amount of latency of the output of the speech classifier; and increasing, by the adaptive smoothing algorithm, the dialog smoothing factor according to the amount of latency. A higher latency corresponds to a higher amount of increase. The amount of increase can linearly correspond to the amount of latency. Measuring the amount of latency and increasing the dialog smoothing factor can occur real-time. Each of the first portion of the audio content includes a given number of one or more frames. The dialog smoothing factor can be set to an optimum value for reducing false positives. The optimum value for reducing false positives is 500 millisecond (ms). The dialog smoothing factor can be set to an optimum value for boosting dialog. The optimum value boosting dialog can be between 50 and 100 millisecond (ins), inclusive.

A dialog enhancer enhances (460) the audio content based on the adjusted dialog smoothing factor to generate enhanced audio. During the enhancing, a higher value of the dialog smoothing factor reduces false positives in the enhancing and a lower value of the dialog smoothing factor increases dialogue boost in the enhancing. The system then provides (470) the enhanced audio content to a downstream device, e.g., a processor, an amplifier, a streaming servicer, or a storage medium for processing, playback, streaming, or storage.

Figure 7:
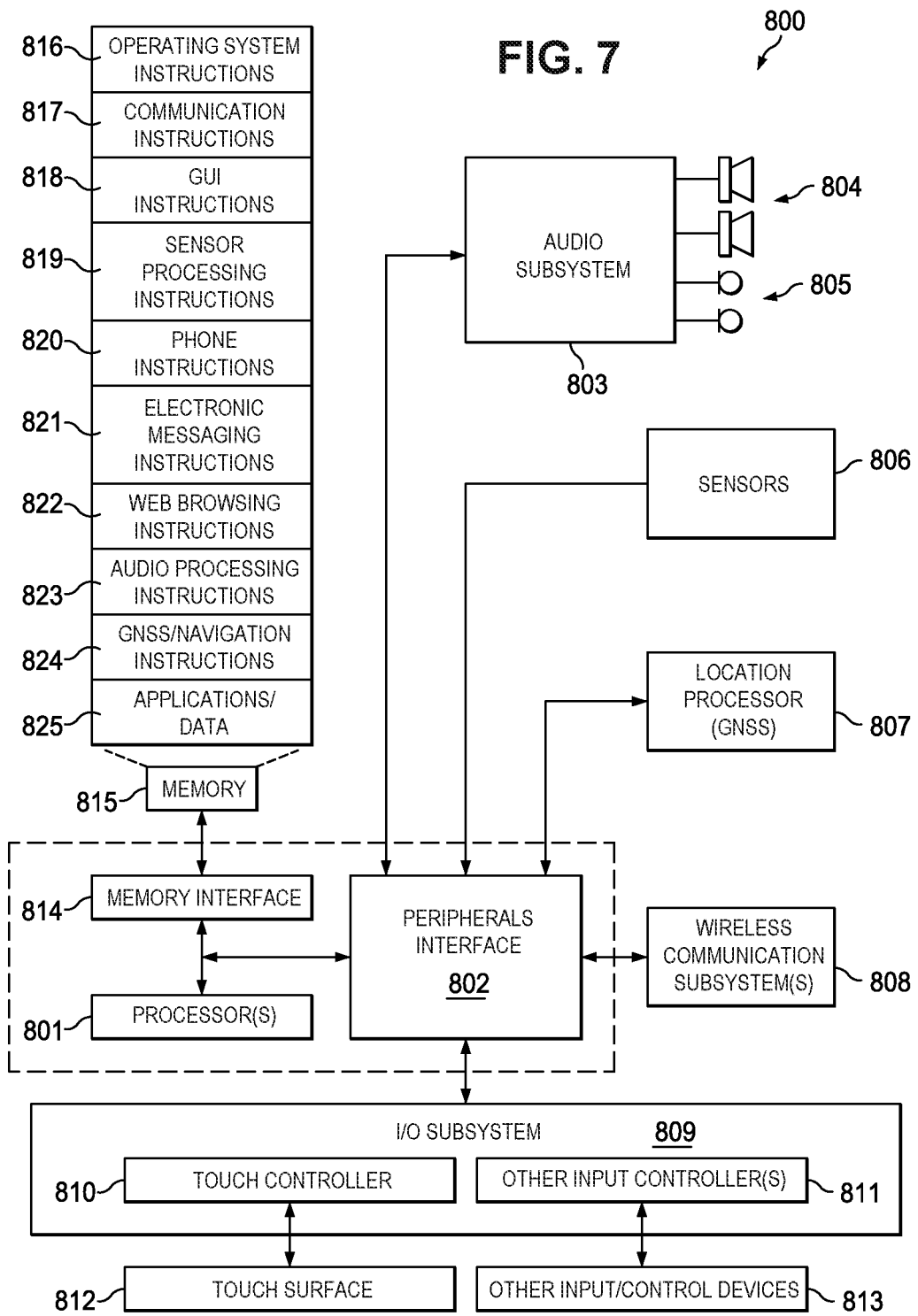
FIG. 7 is a mobile device architecture for implementing the features and processes described in reference to FIGS. 1-6, according to an embodiment.

FIG. 7 is a mobile device architecture for implementing the features and processes described in reference to FIGS. 1-4, according to an embodiment. Architecture 800 can be implemented in any electronic device, including but not limited to: a desktop computer, consumer audio/visual (AV) equipment, radio broadcast equipment, mobile devices (e.g., smartphone, tablet computer, laptop computer, wearable device). In the example embodiment shown, architecture 800 is for a smart phone and includes processor(s) 801, peripherals interface 802, audio subsystem 803, loudspeakers 804, microphone 805, sensors 806 (e.g., accelerometers, gyros, barometer, magnetometer, camera), location processor 807 (e.g., GNSS receiver), wireless communications subsystems 808 (e.g., Wi-Fi, Bluetooth, cellular) and 110 subsystem(s) 809, which includes touch controller 810 and other input controllers 811, touch surface 812 and other input/control devices 813. Other architectures with more or fewer components can also be used to implement the disclosed embodiments.

Memory interface 814 is coupled to processors 801, peripherals interface 802 and memory 815 (e.g., flash, RAM, ROM). Memory 815 stores computer program instructions and data, including but not limited to: operating system instructions 816, communication instructions 817, GUI instructions 818, sensor processing instructions 819, phone instructions 820, electronic messaging instructions 821, web browsing instructions 822, audio processing instructions 823, GNSS/navigation instructions 824 and applications/data 825. Audio processing instructions 823 include instructions for performing the audio processing described in reference to FIGS. 1-4.

Aspects of the systems described herein may be implemented in an appropriate computer-based sound processing network environment for processing digital or digitized audio files. Portions of the adaptive audio system may include one or more networks that comprise any desired number of individual machines, including one or more routers (not shown) that serve to buffer and route the data transmitted among the computers. Such a network may be built on various different network protocols, and may be the Internet, a Wide Area Network (WAN), a Local Area Network (LAN), or any combination thereof.

One or more of the components, blocks, processes or other functional components may be implemented through a computer program that controls execution of a processor-based computing device of the system. It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

List of enumerated exemplary embodiments (EEE):

EEE1. A method of enhancing dialog intelligibility in audio, comprising:
  receiving, by a speech and music classifiers of a dialog enhancement system, an audio signal, the audio signal including audio content;
  determining, by the speech classifier, a confidence score that the audio content includes pure speech content;
  determining, by the music classifier, a confidence score that the audio content includes music correlated content;
  in response to an output of the speech and music classifiers, calculating, by an adaptive smoothing algorithm, a higher value of a dialog smoothing factor for the music correlated content and a lower value of the dialog smoothing factor for the pure speech content;
  adjusting the dialog smoothing factor by the adaptive smoothing algorithm based on a measured signal to noise ratio (SNR) of the audio content, wherein a lower SNR value corresponds to a larger increase of the dialog smoothing factor; and
  enhancing, by a dialog enhancer, the audio content based on the adjusted dialog smoothing factor to generate enhanced audio, wherein a higher value of the dialog smoothing factor reduces false positives in the enhancing and a lower value of the dialog smoothing factor increases dialogue boost in the enhancing,
  wherein each of the determining, calculating, adjusting and enhancing is performed by one or more processors.

EEE2. The method of EEE1, comprising adjusting the dialog smoothing factor based on latency, the latency-based adjusting including:
  measuring, by a transient detector, an amount of latency of the output of the speech classifier; and
  increasing, by the adaptive smoothing algorithm, the dialog smoothing factor according to the amount of latency, wherein a higher latency corresponds to a higher amount of increase.

EEE3. The method of EEE2, wherein the amount of increase linearly corresponds to the amount of latency.

EEE4. The method of EEE2 or EEE3, wherein measuring the amount of latency and increasing the dialog smoothing factor occurs real-time.

EEE5. The method of any of EEEs 1-4, wherein each of the music correlated content includes a given number of one or more frames.

EEE6. The method of any of EEEs 1-5, wherein the dialog smoothing factor is set to an optimum value for reducing false positives.

EEE7. The method of EEE6, wherein the optimum value for reducing false positives is 500 millisecond (ms).

EEE8. The method of any of EEEs 1-7, wherein the dialog smoothing factor is set to an optimum value for boosting dialog.

EEE9. The method of EEE8, wherein the optimum value for boosting dialog is between 50 and 100 millisecond (ins), inclusive.

EEE10. A system comprising:
  one or more computer processors; and
  a non-transitory computer-readable medium storing instructions that, upon execution by the one or more processors, cause the one or more processors to perform operations of any one of claims EEE1-EEE9.

EEE11. A non-transitory computer-readable medium storing instructions that, upon execution by one or more computer processors, cause the one or more processors to perform operations of any one of EEE1-EEE9.

The invention claimed is:

1. A method of enhancing dialog intelligibility in an audio signal, comprising, for each frame of the audio signal:
  determining, by a speech classifier, a speech confidence score that the frame includes speech content;
  determining, by a music classifier, a music confidence score that the frame includes music correlated content; and
  in response to said speech confidence score, applying, by a dialog enhancement module, a user selected gain of selected frequency bands of the audio signal to obtain a dialog enhanced audio signal, the method is characterized in that the user selected gain is smoothed by an adaptive smoothing algorithm, an impact of past frames in said smoothing algorithm being determined by a smoothing factor,
  said smoothing factor being selected in response to said music confidence score, and having a relatively higher value for content having a relatively higher music confidence score and a relatively lower value for speech content having a relatively lower music confidence score, so as to increase the impact of past frames on the dialog enhancement of music correlated content,
  wherein the adaptive smoothing algorithm is a weighted average according to:

$$\text{Out}(n) = \alpha \text{Out}(n-1) + (1-\alpha)\text{In}(n),$$

where Out(n) is a smoothed output gain of the current frame, Out(n−1) is a smoothed output gain of the previous frame, In(n) is an original input gain of the current frame, and a is an adaptively adjusted variable that varies exponentially as a function of the smoothing factor.

2. The method according to claim 1, wherein said smoothing factor is expressed as a time period, and relates to a filtering window of the smoothing algorithm.

3. The method of claim 2, wherein the first, higher smoothing factor is 500 millisecond (ms).

4. The method of claim 2, wherein the second, lower smoothing factor is between 50 and 100 millisecond (ms).

5. The method of claim 1, further comprising:
measuring a latency in the speech classifier, and
adjusting said smoothing factor based on the measured latency, wherein a higher latency corresponds to a larger smoothing factor.

6. The method of claim 5, wherein the amount of increase of the smoothing factor linearly corresponds to the amount of latency.

7. The method of claim 5, wherein measuring the latency and increasing the smoothing factor occurs in real-time.

8. The method according to claim 1, wherein a first, higher, smoothing factor is selected when the music confidence score is above a given threshold, and a second, lower, smoothing factor is selected when the music confidence score is below the given threshold.

9. The method according to claim 1, further comprising:
measuring a signal to noise ratio, SNR, in the audio signal, and
adjusting said smoothing factor based on the measured SNR, wherein a lower SNR value corresponds to a larger smoothing factor.

10. The method of claim 1, wherein the relatively higher value of the smoothing factor is selected to reduce false positives.

11. The method of claim 1, wherein the relatively lower value of the smoothing factor is selected to boost dialog.

12. The method of claim 1, wherein $\alpha$ is defined as:

$$\alpha = 0.5^{samples\ per\ frame/(sample\ rate * smoothing\ factor)}.$$

13. A system comprising:
one or more computer processors; and
a non-transitory computer-readable medium storing instructions that, upon execution by the one or more processors, cause the one or more processors to perform the method of claim 1.

14. A non-transitory computer-readable medium storing instructions that, upon execution by one or more computer processors, cause the one or more processors to perform the method of claim 1.

* * * * *